(12) United States Patent
Wald et al.

(10) Patent No.: US 6,407,455 B1
(45) Date of Patent: Jun. 18, 2002

(54) LOCAL INTERCONNECT USING SPACER-MASKED CONTACT ETCH

(75) Inventors: Phillip G. Wald; Kunal R. Parekh, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/612,677

(22) Filed: Jul. 10, 2000

Related U.S. Application Data (62) Division of application No. 08/811,488, filed on Mar. 5, 1997, now Pat. No. 6,107,189.

(51) Int. Cl.$^7$ .............................................. H01L 23/52
(52) U.S. Cl. ........................ 257/774; 257/775; 257/776
(58) Field of Search ................................. 257/776, 775, 257/774, 773, 368, 390

(56) References Cited

U.S. PATENT DOCUMENTS

| | | | | |
|---|---|---|---|---|
| 5,112,765 A | * | 5/1992 | Cedarbaum et al. | |
| 5,410,185 A | * | 4/1995 | Yeh | |
| 5,490,901 A | | 2/1996 | Kim | 156/643.1 |
| 5,658,830 A | | 8/1997 | Jeng | 438/620 |
| 5,861,676 A | * | 1/1999 | Yen | |
| 5,895,961 A | * | 4/1999 | Chen | |

* cited by examiner

*Primary Examiner*—Keith Christianson
*Assistant Examiner*—Stephen W. Smoot
(74) *Attorney, Agent, or Firm*—Fletcher, Yoder & Van Someren

(57) ABSTRACT

A semiconductor device including a structure having an upper surface and an contact surface formed at the upper surface of the structure. An insulating material is formed over the contact surface and a conductive runner extends over the active area such that a lower surface of the conductive runner is above and separated from the active area. A widened portion is formed in the conductive runner with an opening formed in the widened portion and self-aligned to edges of the widened portion. A conductive pillar is self-aligned to the opening and extends downward through the opening, through the insulating material, to the active area. The conductive runner provides local interconnection that can be routed over device features formed in and on the structure without using an additional metal layer.

16 Claims, 6 Drawing Sheets

LOCAL INTERCONNECT USING SPACER-MASKED CONTACT ETCH

This application is a Divisional of application Ser. No. 08/811,488, filed on Mar. 5, 1997, which issued as U.S. Pat. No. 6,107,189 on Aug. 22, 2000.

BACKGROUND OF THE INVENTION

1. Field of the Invention

The present invention relates generally to interconnect structures for integrated circuits and, more particularly, to a local interconnect manufactured with fewer mask steps for random access memory circuits.

2. Background of the Related Art

Random access memories, in both dynamic (DRAM) and static (SRAM) forms, are complex integrated circuits that have become commodity items in the electronics industry. Despite their complexity, price competition requires that memory designs be inexpensive to manufacture while at the same time maintaining high performance and high reliability. For example, it can be a significant advantage if a memory design can eliminate one or more processing steps. In particular, many integrated circuits use multiple layers of patterned metallization to provide interconnect wiring between devices. Each layer of metallization increases cost significantly while creating additional reliability concerns created by the additional processing. Hence, it is typically desirable to minimize the number metallization layers required to implement a design.

The present invention may be directed to one or more of the problems set forth above.

SUMMARY OF THE INVENTION

In accordance with one aspect of the present invention, there is provided a method of manufacturing an interconnection for an integrated circuit. The method includes the steps of: (a) disposing a layer of dielectric material on a substrate; (b) forming a mask over the dielectric material, the mask having a first window portion and a second window portion; (c) removing a portion of the layer of dielectric material under the first window portion to form a first cavity portion and removing a portion of the layer of dielectric material under the second window portion to form a second cavity portion; (d) disposing a layer of masking material into the first cavity portion and the second cavity portion, the layer of masking material completely filling the first cavity portion and partially filling the second cavity portion; (e) removing a portion of the masking material to expose a bottom portion of the second cavity portion; (f) removing a portion of the layer of dielectric material under the exposed bottom portion of the second cavity portion to extend the second cavity portion; and (g) filling the first cavity portion and the second cavity portion with conductive material.

In accordance with another aspect of the present invention, there is provided a method of manufacturing an interconnection for an integrated circuit. The method includes the steps of: (a) disposing a layer of dielectric material on a substrate; (b) forming a mask over the dielectric material, the mask having a first window portion and a second window portion; (c) removing a portion of the layer of dielectric material under the first window portion to form a first cavity portion and removing a portion of the layer of dielectric material under the second window portion to form a second cavity portion; (d) disposing a layer of masking material into the first cavity portion and the second cavity portion, the layer of masking material completely filling the first cavity portion and partially filling the second cavity portion; (e) removing a portion of the masking material to expose a bottom portion of the second cavity portion; (f) removing a portion of the layer of dielectric material under the exposed bottom portion of the second cavity portion to extend the second cavity portion; (g) removing the masking material; and (h) filling the first cavity portion and the second cavity portion with conductive material.

In accordance with still another aspect of the present invention, there is provided a method of manufacturing an interconnection for an integrated circuit. The method includes the steps of: (a) disposing a layer of dielectric material on a substrate; (b) forming a mask over the dielectric material, the mask having a first window portion and a second window portion; (c) removing a portion of the layer of dielectric material under the first window portion to form a first cavity portion and removing a portion of the layer of dielectric material under the second window portion to form a second cavity portion; (d) disposing a layer of conductive material into the first cavity portion and the second cavity portion, the layer of masking material completely filling the first cavity portion and partially filling the second cavity portion; (e) removing a portion of the conductive material to expose a bottom portion of the second cavity portion; (f) removing a portion of the layer of dielectric material under the exposed bottom portion of the second cavity portion to extend the second cavity portion; and (g) filling the second cavity portion with conductive material.

In accordance with yet another aspect of the present invention, there is provided a method of manufacturing an interconnection for an integrated circuit. The method includes the steps of: (a) disposing a layer of dielectric material on a substrate; (b) forming a mask over the dielectric material, the mask having a window therein, the window having an elongated portion and a widened portion; (c) removing a portion of the layer of dielectric material under the window to form a cavity having an elongated portion and a widened portion; (d) disposing a layer of masking material into the cavity, the layer of masking material completely filling the elongated portion of the cavity and partially filling the widened portion of the cavity; (e) removing a portion of the masking material to expose a bottom portion of the widened portion of the cavity; (f) removing a portion of the layer of dielectric material under the exposed bottom portion of the widened portion of the cavity; and (g) filling the cavity with conductive material.

In accordance with a further aspect of the present invention, there is provided a method of manufacturing an interconnection for an integrated circuit. The method includes the steps of: (a) disposing a layer of dielectric material on a substrate; (b) forming a mask over the dielectric material, the mask having a window therein, the window having an elongated portion and a widened portion; (c) removing a portion of the layer of dielectric material under the window to form a cavity having an elongated portion and a widened portion; (d) disposing a layer of masking material into the cavity, the layer of masking material completely filling the elongated portion of the cavity and partially filling the widened portion of the cavity; (e) removing a portion of the masking material to form a spacer in the widened portion of the cavity and to expose a bottom portion of the widened portion of the cavity; (f) using an etchant to remove a portion of the layer of dielectric material under the exposed bottom portion of the widened portion of the cavity, the etchant removing the spacer at a slower rate than the layer of dielectric material under the exposed bottom portion of the widened portion of the cavity; and (g) filling the cavity with conductive material.

In accordance with a still further aspect of the present invention, there is provided a method of coupling a gate of a first transistor to an active region of a second transistor. The method includes the steps of: (a) disposing a layer of dielectric material over the first transistor and the second transistor; (b) forming a mask over the dielectric material, the mask having a window therein, the window having an elongated portion extending between the first transistor and the second transistor, and the window having a first widened portion over the gate of the first transistor and a second widened portion over the active region of the second transistor; (c) removing a portion of the layer of dielectric material under the window to form a cavity having an elongated portion, a first widened portion, and a second widened portion; (d) disposing a layer of masking material into the cavity, the layer of masking material completely filling the elongated portion of the cavity and partially filling the first and second widened portions of the cavity; (e) removing a portion of the masking material to expose a bottom portion of the first widened portion of the cavity and to expose a bottom portion of the second widened portion of the cavity; (f) removing a portion of the layer of dielectric material under the exposed bottom portion of the first widened portion of the cavity to extend the first widened portion of the cavity to the gate of the first transistor, and removing a portion of the layer of dielectric material under the exposed bottom portion of the second widened portion of the cavity to extend the second widened portion of the cavity to the active region of the second transistor; and (g) filling the cavity with conductive material.

In accordance with a yet further aspect of the present invention, there is provided a method of coupling a terminal of a first transistor to a terminal of a second transistor. The method includes the steps of: (a) disposing a layer of dielectric material over the first transistor and the second transistor; (b) forming a mask over the dielectric material, the mask having a window therein, the window having an elongated portion extending between the first transistor and the second transistor, and the window having a first widened portion over the terminal of the first transistor and a second widened portion over the terminal of the second transistor; (c) removing a portion of the layer of dielectric material under the window to form a cavity having an elongated portion, a first widened portion, and a second widened portion; (d) disposing a layer of masking material into the cavity, the layer of masking material completely filling the elongated portion of the cavity and partially filling the first and second widened portions of the cavity; (e) removing a portion of the masking material to expose a bottom portion of the first widened portion of the cavity and to expose a bottom portion of the second widened portion of the cavity; (f) removing a portion of the layer of dielectric material under the exposed bottom portion of the first widened portion of the cavity to extend the first widened portion of the cavity to the terminal of the first transistor, and removing a portion of the layer of dielectric material under the exposed bottom portion of the second widened portion of the cavity to extend the second widened portion of the cavity to the terminal of the second transistor; and (g) filling the cavity with conductive material.

In accordance with an even further aspect of the present invention, there is provided a transistor interconnection between a first transistor and a second transistor. The first transistor has a first active region bisected by a first gate electrode, and the second transistor has a second active region bisected by a second gate electrode. The interconnection includes a first conductive contact formed in a dielectric layer covering the first and second transistors. The first contact is positioned over and coupled to the first active region of the first transistor. A second conductive contact is formed in the dielectric layer. The second contact is positioned over and coupled to the second gate electrode in the second active region. A conductive runner is formed in the dielectric layer. The conductive runner is coupled to the first conductive contact and to the second conductive contact. The conductive runner extends therebetween over a portion of the first active region and over a portion of the second active region.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

Certain problems of the prior art may be solved by a novel structure and process, examples of which are described below. A conductive interconnect layer that is embedded in an insulating layer over device structures, while having an upper surface that is planar with the insulating layer, provides the desired electrical connection. The interconnect structure is formed simultaneously with a pedestal contact to the device structures and, hence, requires no additional processing steps.

Turning now to the drawings, FIG. 1, FIG. 2, FIG. 3A, and FIG. 3B illustrate features of a first embodiment of a local interconnect in overview. In particular, these drawings illustrate the simultaneous formation of contacts and interconnecting runners without additional masking, deposition, or etching steps. Although metal oxide semiconductor (MOS) devices are shown by example, it should be understood that this disclosure may be applicable to other semiconductor technologies.

Figure 1:
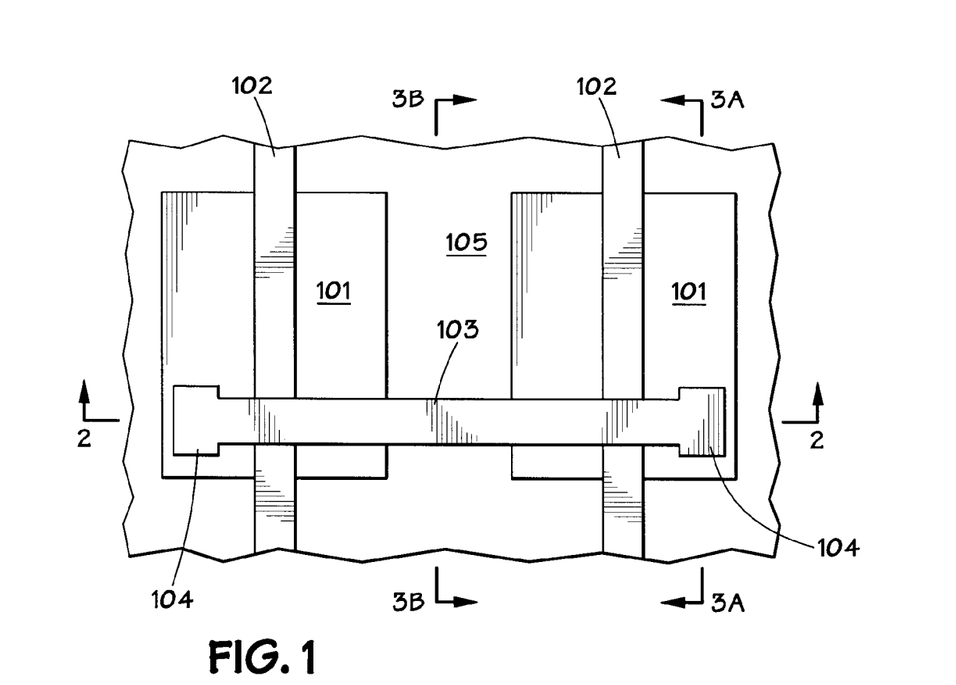
FIG. 1 shows a plan view of a portion of an integrated circuit chip having the local interconnect structure in accordance with the present invention.

FIG. 1 shows in a plan view a portion of a semiconductor integrated circuit having first and second adjacent active areas 101. Device structures (not shown in FIG. 1), such as the source and drain regions of a transistor, are formed in active areas 101. Active area 101 may include contact areas that use relatively conductive materials, such as semiconductors, doped polycrystalline silicon, or various types of metallization known in the semiconductor industry.

Active areas 101 are surrounded by field oxide 105 formed using any suitable field oxide technology, such as LOCOS. Field oxide 105 electrically isolates active areas 101 from one another. Each active area 101 is traversed by an electrode, such as, for example, a gate electrode 102. Gate electrode 102 includes one or more conductive layers electrically isolated from the surface of active area 101 by a gate oxide or gate insulating layer. The actual selection of materials used for gate electrode 102 are not believed to be critical, so a variety of materials may be suitable. Typically, a source region is disposed on one side of gate electrode 102 in active area 101, and a drain region is disposed on the other side of the gate electrode 102 in active area 101.

Although not shown in FIG. 1, it is known to form conductive straps in or over the active regions 101 parallel to gate electrodes 102. These straps make electrical contact along the entire length of active area 101 and provide an upper surface that overlying device structures may contact. However, this technology has not been applied to create connections, such as runner 103, that extend across one or more gate regions 102 to form local interconnections.

Local interconnect runner 103 comprises a narrow strip of conductive material that extends between the active regions 101 and forms a contact 104 with each active region 101. As discussed in greater detail below, contact 104 may be a self-aligned buried contact reaching down to a lower contact surface in active area 101. The opening in widened portion 104 (not visible in FIG. 1) is filled with a conductive material, such as doped polysilicon, tungsten, multi-layer metal, or the like.

Figure 2:
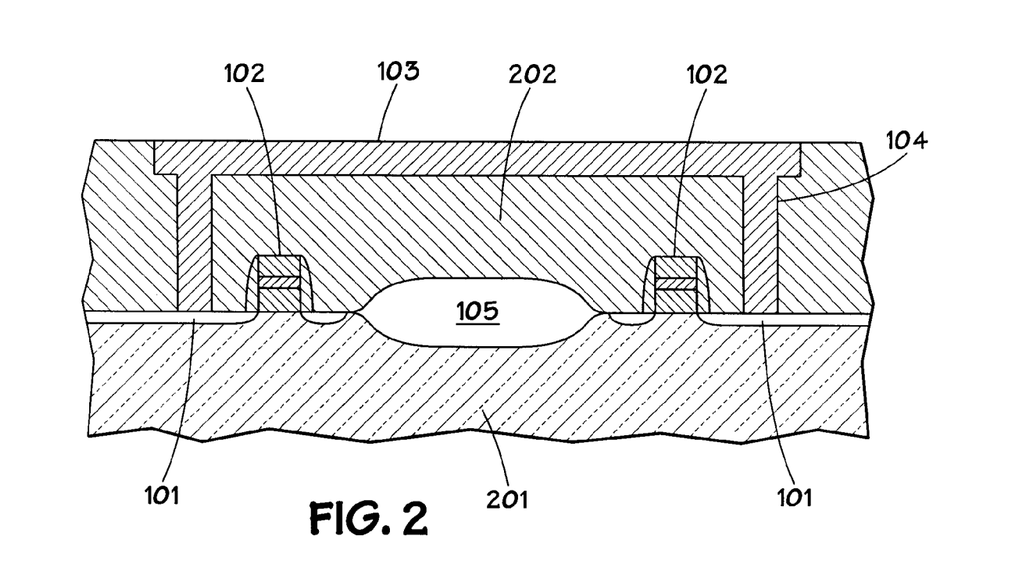
FIG. 2 shows a cross-section of the chip shown in FIG. 1.

FIG. 2 illustrates a cross-sectional view of FIG. 1 taken along line 2–2'. Structure 201 is a single crystal semiconductor structure, in a particular example, having active areas 101 formed by diffused or implanted regions in the upper surface of structure 201. Alternatively, active areas 101 could be formed on the surface of structure 201 rather than diffused or implanted into structure 201. Structure 201 may be a substrate, such as a semiconductor, semi-insulating, or multi-layer structure.

Field oxide region 105 separates active areas 101 of adjacent transistors. As shown in FIG. 2, gates 102 are preferably formed from a plurality of layers including conducting, semi-conducting, and insulating layers. An interlayer dielectric, such as boron phosphor silicate glass (BPSG), covers gate structures 102 and the upper surface of structure 201, including active areas 101 and field oxide 105.

Contacts 104 extend downward from the surface of dielectric layer 202 to make electrical contact with active area 101. Contacts 104 resemble conductive pillars extending from the upper surface of structure 101 and active area 101 to the upper surface of dielectric 202. Conductive runners 103 are formed to couple together the upper portions of the conductive pillars that form contacts 104. The upper surface of runners 103 is flush or planar with the upper surface of interlayer dielectric 202 allowing for easier connection to conductive structures formed above runner 103 (not shown). Runners 103 have a lower surface that is disposed above, and thus insulated from, device structures associated with the active areas 101, such as gates 102, and field oxide 105, except where runners 103 intersect a contact 104. In this manner, runners 103 provide an effective local interconnection between adjacent transistors as shown in FIG. 2 without the use of an additional metallization layer.

Figure 3A:
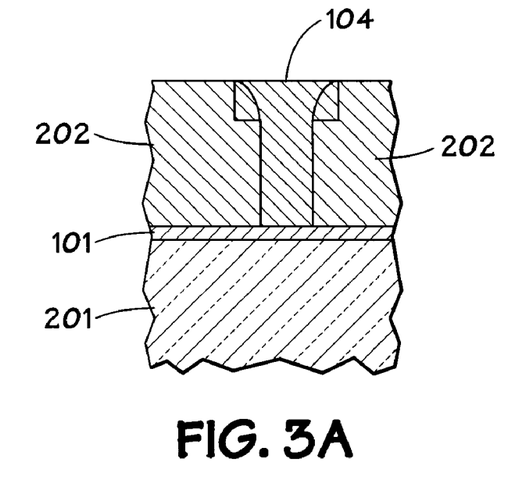
FIGS. 3A and 3B show cross-sections of the chip shown in FIG. 1 taken orthogonally to FIG. 2.
Figure 3B:
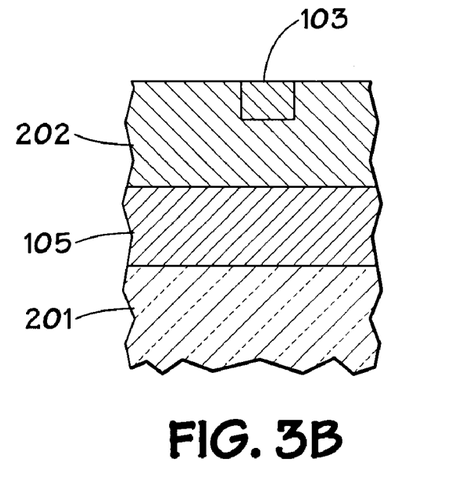

The cross-sections shown in FIG. 3A and FIG. 3B compare the structure of contacts 104 with the structure of runners 103. In FIG. 3A, contact region 104 is shown as a T-shaped conductive pillar that reaches active area 101 and makes electrical contact to active area 101. In contrast, runner 103 is filled with a conductive material, but does not extend through dielectric 202 to underlying structures.

Figure 4A:
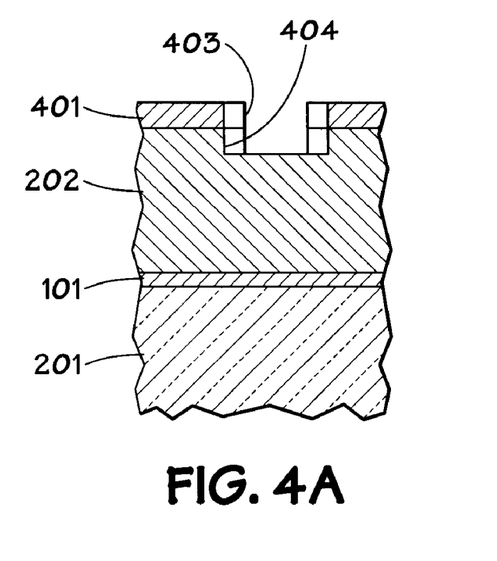
FIGS. 4A and 4B show the structure of FIGS. 3A and 3B at an early stage of processing.
Figure 4B:
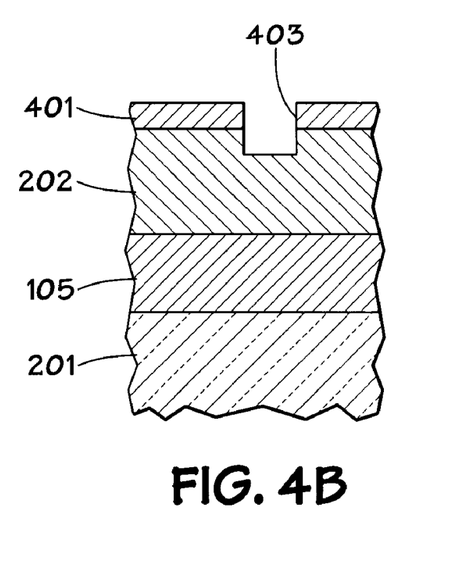

The processing steps used to form the structure shown in FIGS. 3A and 3B are described in greater detail below with reference to FIG. 4A through FIG. 7B. FIG. 4A illustrates the structure shown in FIG. 3A at an early stage of processing. Likewise, FIG. 4B illustrates the structure shown in FIG. 3B at an early stage in processing. In FIG. 4A and FIG. 4B, active area 101 has been formed on or in structure 201 and covered by a layer of dielectric 202. Field oxide region 105, shown in FIG. 4B, has been formed on structure 201 and also covered with dielectric 202.

A hard mask layer 401 is formed on top of dielectric 202. A relatively wide window or opening is formed in hard mask 401 to define a cavity 404, as shown in FIG. 4A. A relatively narrow window or opening is formed in hard mask layer 401 to define a cavity 403, as shown in FIGS. 4A and 4B. As used herein, relative width means width as compared between the thickness of layer 501 shown in FIGS. 5A and 5B. Hard mask layer 401 is patterned to open cavities 404 and 403 using conventional photoresist patterning and etching, using an anisotropic etch for example. Hard mask layer 401 is silicon nitride in this embodiment, but other suitable masking materials may be used.

Alternatively, hard mask layer 401 can be omitted, and a pattern may be transferred directly to dielectric layer or insulating layer 202. However, hard mask 401 protects the upper surface of dielectric 202 from erosion during subsequent processing steps. Therefore, if hard mask 401 is omitted, care should be taken in selecting both the thickness of dielectric 202 and in the chemistry used to dielectric 202 to allow adequate protection against erosion during subsequent processing.

After patterning hard mask layer 401, conventional etch processing, such as an anisotropic etch, is used to form cavities 403 and 404. The cavities 403 and 404 extend partially through dielectric 202. Typically, to ensure electrical isolation, the bottom surface of cavities 403 and 404 is above all device features formed in or on active areas 101. For example, the tops of the gates 102 and field oxide 105 are below the bottom surface of cavities 403 and 404 at the stage shown in FIG. 4A and FIG. 4B.

Figure 5A:
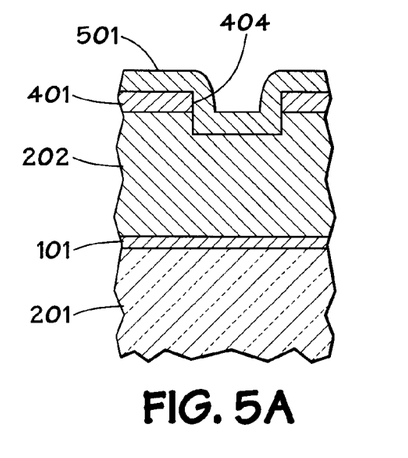
FIGS. 5A and 5B show the structure of FIGS. 4A and 4B at a later stage of processing.
Figure 5B:
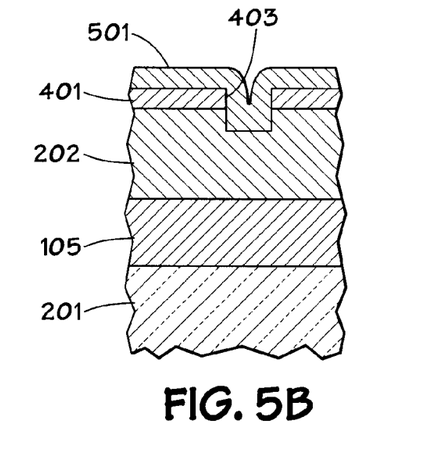

Turning now to FIG. 5A and FIG. 5B, a blanket deposition of conductive material 501 is formed over hard mask 401 and cavities 403 and 404. Conductive material 501 may comprise a suitable conductive material, such as polysilicon, tungsten (W), titanium-tungsten (TiW), or titanium-nitride (TiN). Cavity 404 is sized in conjunction with the thickness of conductive material layer 501 so that the side-walls do not touch together to form a seam as conductive material fills cavity 404. In contrast, cavity 403 is sized in conjunction with the thickness of the conductive material layer 501 so that opposing side-walls come together to close off the cavity 403, although a seam may be formed, as conductive material is applied. Conductive material layer 501 may be applied using conformal thin film processing, such as chemical vapor deposition plating or the like, although other suitable techniques may be used. Also, multi-layer coatings may be used, in which case only some of the layers may be formed of conductive material.

Figure 6A:
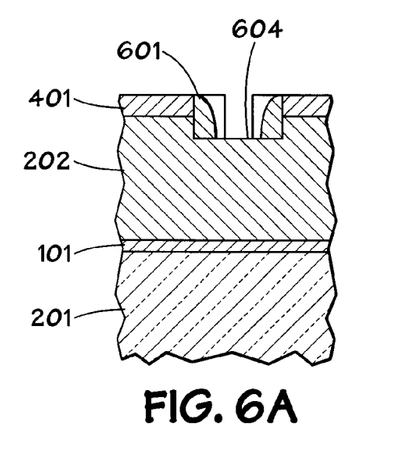
FIGS. 6A and 6B show the structure of FIGS. 5A and 5B at a later stage of processing.
Figure 6B:
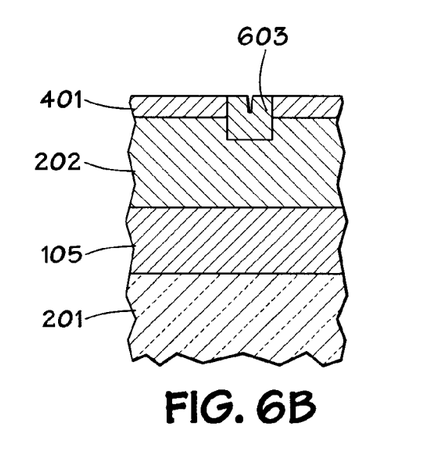

FIG. 6A and FIG. 6B illustrate the structure of FIG. 5A and FIG. 5B, respectively, at a later stage in processing. At this stage, a portion of the conductive material in the layer 501 is removed by etching. This etching forms side-walls 601 in cavity 404 and exposes a bottom portion 604 of cavity 404. However, because cavity 403 is filled with the conductive material 603, this etching merely removes a portion of the conductive material and does not expose a portion of the bottom surface of cavity 403, although a small seam may exist at the upper surface of the conductive material in cavity 403.

Figure 7A:
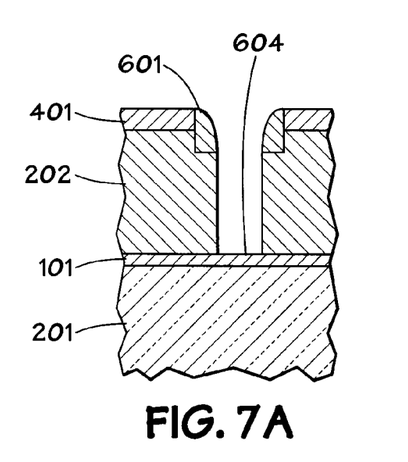
FIGS. 7A and 7B show the structure of FIGS. 6A and 6B at a late stage of processing.
Figure 7B:
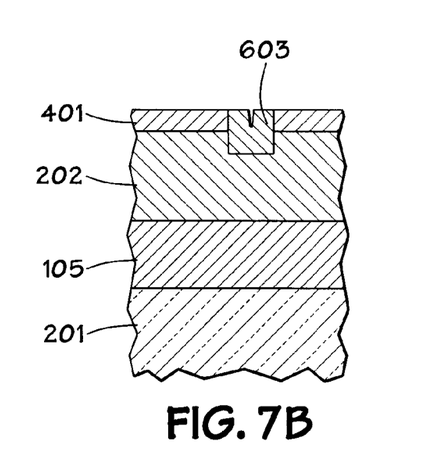

Conductive runner 103 is substantially completely formed at this stage. However, the contacts 104 have not yet been formed. To form the contacts 104, an anisotropic etch is performed using conductive material left over from layer 501 as part of the mask 401, as illustrated in FIGS. 7A and 7B. Hence, side-walls 601 serve as a mask to prevent any etching under runner 103. Thus, a contact opening 604 is formed in the larger cavity 404, but no contact opening is formed in the smaller cavity 403. The etching continues until the contact opening 604 extends down to active area 101 through the remaining portion of dielectric 202. It should be mentioned that the etchant advantageously does not remove any portion of the hard mask 401 or the side-walls 601. However, an etchant may be selected that removes a portion of the hard mask 401 or side-walls 601 so long as the etchant removes the dielectric at a faster rate.

To complete the contact 104, the contact opening 604 is filled with a suitable conductive material using a suitable process, as shown in FIG. 3A. The material may or may not be the same as used for spacers 601. As illustrated in FIG. 7B, this etch and fill process leaves the structure shown in FIG. 6B substantially intact.

Alternatively, conductive layer 501 can be replaced by any disposable conductive, semiconductive, or insulating film that can be removed selectively after completion of the final contact etch shown in FIG. 7A. Where this option is used, the spacers 601 and runner 103 are removed using a suitable removal process. Then, conductive material may be deposited to form the runner 103 and the contacts 104.

Regardless of which process is used, a planarization step typically follows to isolate contact 104 from runners 103 except where desired. Planarization may be accomplished by a suitable process, such as a chemical etch or chemical-mechanical polishing (CMP).

Figure 8:
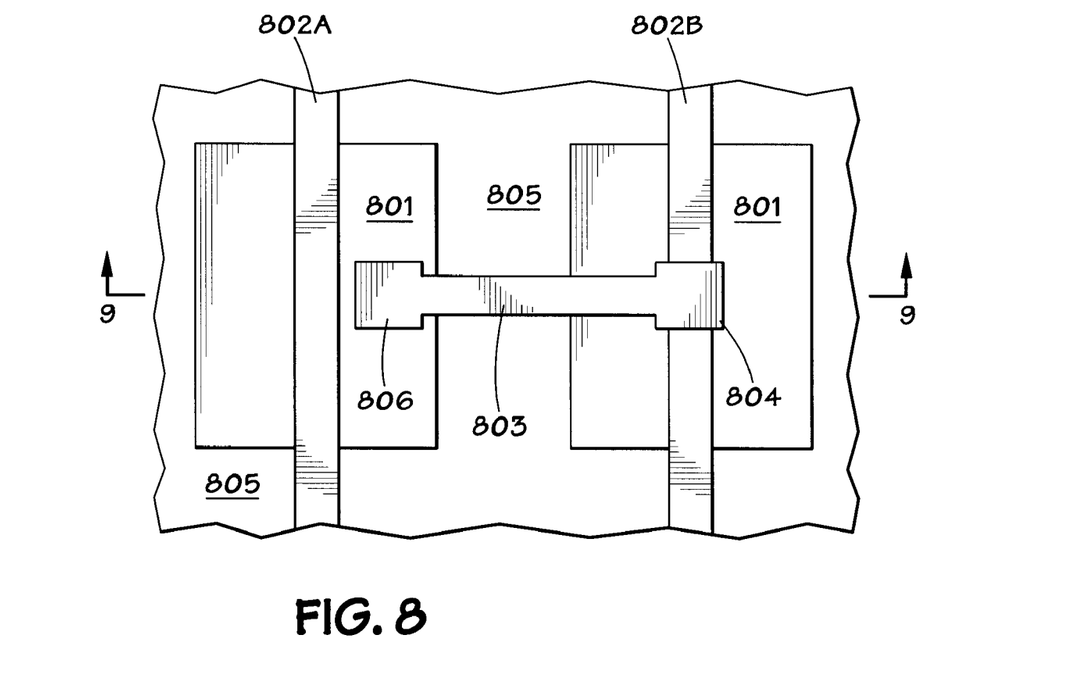
FIG. 8 shows another embodiment of the present invention illustrating gate-to-source connections.

FIG. 8 illustrates a plan view of an alternative embodiment showing how the structure and method could be used to form gate-to-source and gate-to-drain connections between adjacent transistors in adjacent active areas. Until now, such connections have required a second metallization layer and, hence, the additional deposition and patterning processes. In FIG. 8, adjacent active areas 801 are again transected by gate electrodes 802A and 802B. Active areas 801 are surrounded by field oxide 805. In this example, gate electrode 802B contacts the gate in the active area 801 at contact 804. Contact 804 is coupled to a runner 803 and to a contact 806 to couple the gate electrode 802B to the adjacent active area 801.

Figure 9:
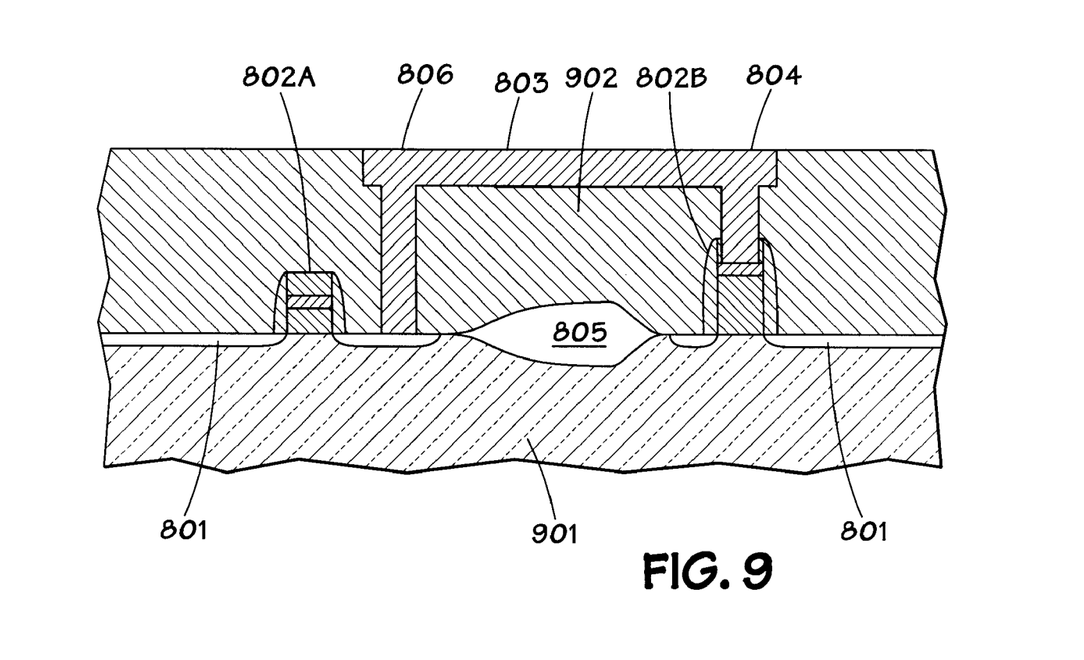
FIG. 9 shows the structure of FIG. 8 in cross-section.

FIG. 9 illustrates a cross-section of the structure shown in FIG. 8. A dielectric layer 902 is formed over gate electrodes 802A and 802B, field oxide 805, and active areas 801. Using the sequence of processes described above, buried contacts 804 and 806 are formed over appropriate areas by providing cavities with wider areas over desired locations. Runner 803 is formed by providing a cavity with a narrow area in contact with the two wider cavities. During the contact etch step, such as shown in FIG. 7A in the previously described process, contacts openings are simultaneously formed on top of gate structure 802B and active area 801. Then, these openings are filled with conductive material, as previously described, to form the contacts 804 and 806 simultaneously.

These methods may also be used to provide a flexible local interconnection between transistors. Because the local interconnects discussed above can be formed under overlying global interconnects, chips can be manufactured with fewer processes while achieving the space benefits of vertically stacked interconnections. Such interconnects may use polysilicon material in their construction which, because of its high resistivity, is usually suitable for short interconnections where power dissipation is not an issue. However, lower resistivity material, such as TiW, TiN, W, or other suitable metallization materials or configurations, may also be used.

Figure 10:
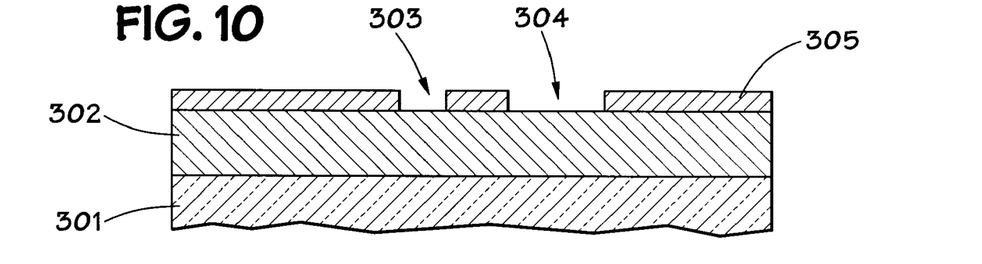
FIG. 10 shows in cross-section an alternative embodiment in accordance with the present invention at an early stage of processing.

These methods may also be adapted to multi-level metal structures as illustrated in FIG. 10 through FIG. 16. In multi-layer metal (MLM) structures, a first metal layer 301 is formed and patterned. The first metal layer 301 is then covered with an insulating dielectric layer, such as an interlayer dielectric (ILD) 302, as shown in FIG. 10. As will be explained below, a second metallization layer may formed on top of ILD 302 and patterned to provide additional interconnections between device components. For, instance, vias, or other suitable conductive interconnections, pass through ILD 302 to couple the interconnect wiring on the upper surface of ILD 302 to the first layer metallization 301 at the lower surface of ILD 302.

As shown in FIG. 10, ILD 302 is formed and preferably planarized over first metal layer 301. A patterned mask layer 305 is formed on top of ILD 302 to provide windows 303 and 304. As discussed below, window 303 will eventually form an interconnect wiring structure, whereas window 304 will provide a via opening allowing contact through ILD 302 to first metal layer 301. In this embodiment, window 303 is approximately 0.35 microns wide, i.e., the smallest pitch available for a 0.35 micron process, and window 304 is approximately 0.6 micron wide.

Figure 11:
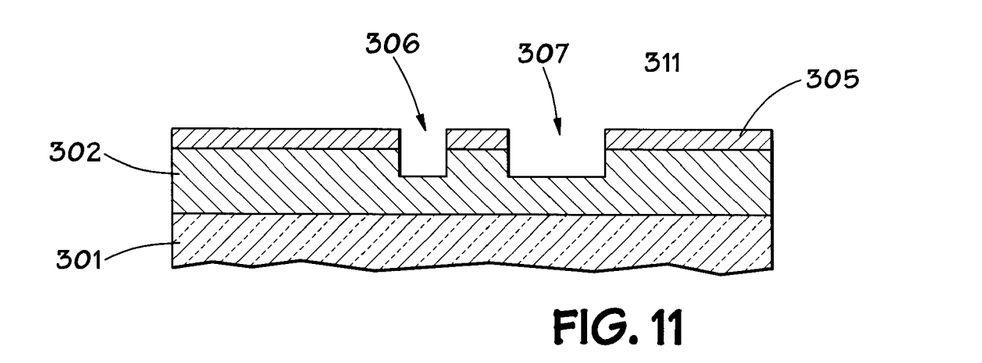
FIG. 11 illustrates the structure of FIG. 10 at a later stage in processing.
Figure 12:
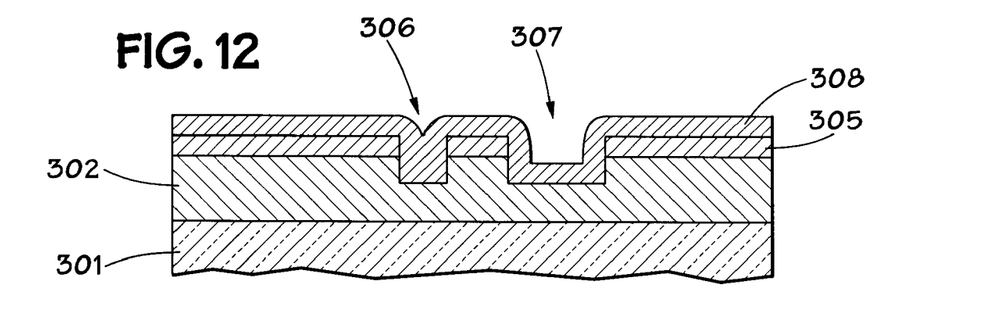
FIG. 12 illustrates the structure of FIG. 11 processed through a deposition.

The etch using the mask 305 produces a first cavity 306 under window 303 and a second cavity 307 under window 304. These cavities extend partially through ILD 302, as shown in FIG. 11. This structure is covered with a thin film layer 308, as illustrated in FIG. 12, which may be composed of dielectric, semiconductor, or insulating material. Optionally, the mask 305 may be removed prior to the deposition of layer 308. However, mask 305 can remain if it is relatively durable material that can withstand the deposition and etch processes that follow.

Figure 13:
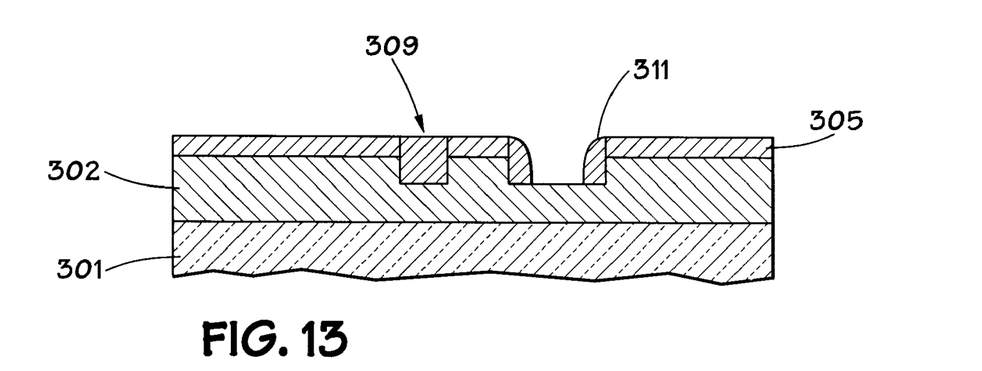
FIG. 13 illustrates the structure of the alternative embodiment at an intermediate stage of processing.

As described in reference to the previous embodiments, narrow cavity 306 is completely filled by film layer 308, although film layer 308 may have a seam at the center. In regard to wide cavity 308, thin film layer 308 covers the side walls and bottom surface, but the side walls do not meet. Using an etching process, as described previously, a portion of thin film layer 308 is removed to provide spacers 311 in cavity 307 and a runner in cavity 306, as shown in FIG. 13.

If a conductive material is used for thin film layer 308, runner 309 becomes an interconnect planar with the upper surface of ILD 302 that may be used to couple various device structures.

Figure 14:
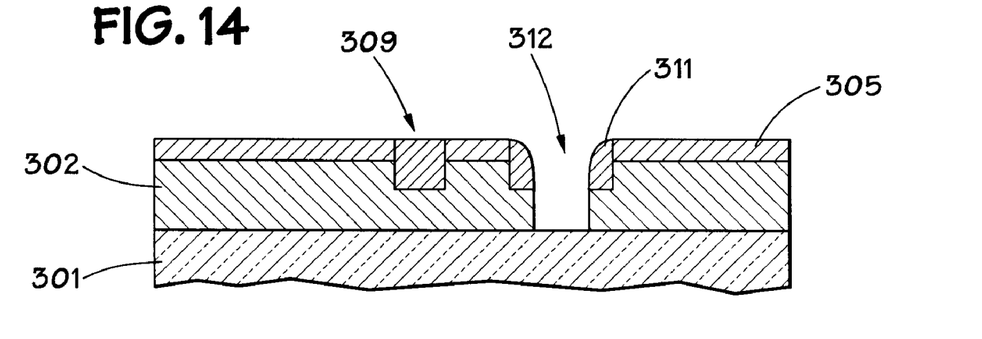
FIG. 14 shows in cross-section the structure of FIG. 12 that they completed via.

Spacers 311 are used in conjunction with the mask 305 to complete the formation of the via hole 312, as shown in FIG. 14. Because cavity 306 is completely sealed by runner 309 and because the material comprising ILD 302 can be selectively etched with respect to the material comprising spacers 311, runner 309, and mask 305, only via 312 is formed during this etch.

Figure 15:
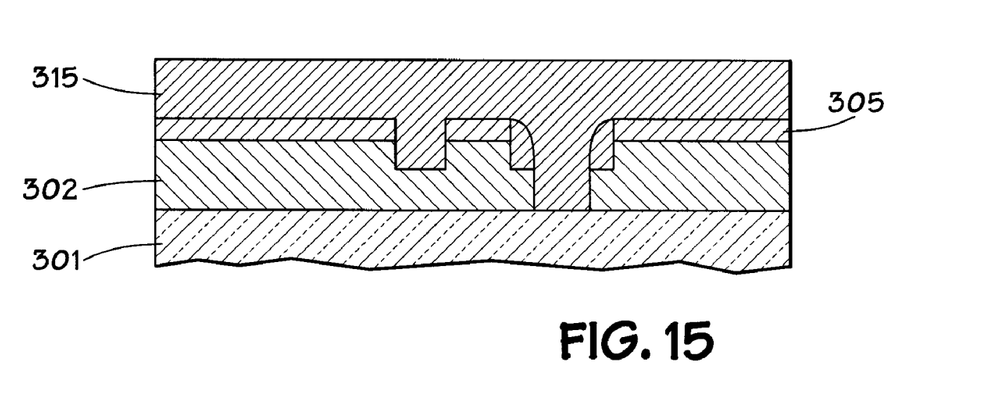
FIG. 15 and FIG. 16 illustrate final stages and completion of the via in accordance with the alternative embodiment.
Figure 16:
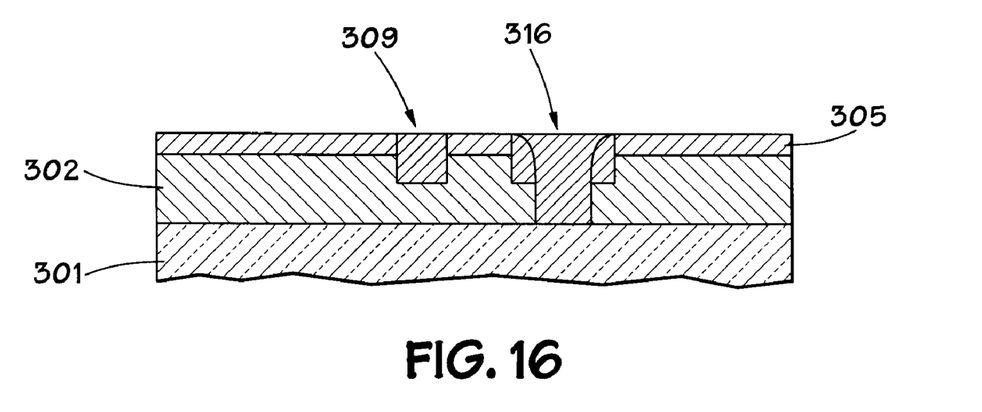

Upon completion of the structure shown in FIG. 14, if disposable material is used for spacers 311 and runner 309, it is now removed. The mask 305 may also be removed. Where conductive material is used, on the other hand, a conductive layer 315 can be applied over interconnect 309 and filling via 312, as shown in FIG. 15. Conductive layer 315 forms a second level metallization and any compatible metallization process, including single or multiple layers, can be used. Layer 315 can be patterned, if desired, using conventional photo patterning techniques. It is possible, however, that interconnects 309 will provide sufficient interconnectivity for the second level metallization and avoid the metal patterning step altogether. As shown in FIG. 16, the portion of conductive layer 315 extending above the upper surface of ILD 302 is removed by an appropriate process, such as chemical etching or CMP, to isolate interconnects 309 from via structure 316. Of course, where connection is desired between via 316 and an interconnect 309, one can be easily provided as described in the earlier embodiments. In this manner a second level interconnect or metallization structure is formed at the same time as the vias between the second level metal and first level metal are formed in a minimal number of process steps.

As discussed in reference to the embodiments described above, an interconnect structure can be formed simultaneously with buried contacts. Thus, circuits can be manufactured with fewer processes while achieving the space benefits of vertically stacked interconnections.

While the invention may be susceptible to various modifications and alternative forms, specific embodiments have been shown by way of example in the drawings and have been be described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A transistor interconnection between a first transistor and a second transistor, the first transistor having a first active region transected by a first gate electrode and the second transistor having a second active region transected by a second gate electrode, the interconnection comprising:
    a first conductive contact formed in a dielectric layer covering the first and second transistors, the first contact being positioned over and coupled to the first active region of the first transistor;
    a second conductive contact formed in the dielectric layer, the second contact being positioned over and coupled only to the second gate electrode in the second active region; and
    a conductive runner formed in the dielectric layer, the conductive runner being coupled to the first conductive contact and to the second conductive contact and extending therebetween.

2. The interconnection as recited in claim 1, wherein an upper surface of the conductive runner is substantially planar with an upper surface of the dielectric layer.

3. The interconnection as recited in claim 1, wherein the conductive runner, the first conductive contact, and the second conductive contact are formed simultaneously.

4. An integrated circuit structure, comprising:
    a first conductive feature;
    an insulating layer disposed over the first conductive feature;
    a pattern formed in the insulating layer;
    a first conductive layer formed over the pattern, the first conductive layer having a thickness, wherein the pattern includes a first window formed over the first conductive feature and a second window, and wherein the first window has a wide width relative to the thickness of the first conductive layer and the second window has a narrow width relative to the thickness of the first conductive layer;
    a via formed in the first window, the via extending through the insulating layer and coupled to the first conductive feature; and
    a conductive runner formed in the insulating layer through the second window.

5. The integrated circuit structure as recited in claim 4, wherein the conductive runner is formed simultaneously with the via being formed in the first window.

6. The integrated circuit structure as recited in claim 4, wherein an upper surface of the conductive runner is substantially planar with an upper surface of the insulating layer.

7. The integrated circuit structure as recited in claim 4, wherein the via is coupled to the conductive runner.

8. The integrated circuit structure as recited in claim 4, wherein the first conductive feature is one of a second conductive layer, a gate, and an active region.

9. The integrated circuit structure as recited in claim 8, wherein the second conductive layer comprises a metal.

10. The integrated circuit structure as recited in claim 4, wherein the wide width of the first window is approximately 0.6 microns.

11. The integrated circuit structure as recited in claim 10, wherein the narrow width of the second window is approximately 0.35 microns.

12. An interconnection for an integrated circuit, comprising:
    a substrate having a first contact site and a second contact site;
    a dielectric layer disposed over the substrate;
    a first contact having an upper portion and a lower portion, the upper portion being wider than the lower portion, the upper portion having first conductive sidewalls defining the width of the lower portion, the lower portion extending through the dielectric layer and coupled to the first contact site;
    a second contact having an upper portion and a lower portion, the upper portion of the second contact being wider than the lower portion of the second contact, the upper portion of the second contact having second conductive sidewalls defining the width of the lower portion of the second contact, the lower portion of the second contact extending through the dielectric layer and coupled to the second contact site; and a conductive runner formed in the dielectric layer, the conductive runner coupled to the first and second contacts and extending therebetween.

13. The interconnection as recited in claim 12, wherein the conductive runner is narrower than the upper portions of the first and second contacts.

14. An interconnection as recited in claim 12, wherein the conductive runner is formed simultaneously with the first and second contacts.

15. The interconnection as recited in claim 12, wherein an upper surface of the conductive runner is substantially planar with an upper surface of the dielectric layer.

16. The interconnection as recited in claim 12, wherein the first contact site is one of a gate and an active region, and wherein the second contact site is one of a gate and an active region.

\* \* \* \* \*